United States Patent [19]

Johnson et al.

[11] Patent Number: 4,769,269
[45] Date of Patent: Sep. 6, 1988

[54] ARTICLE CONTAINING CONDUCTIVE THROUGH-HOLES

[75] Inventors: Daniel D. Johnson, Yorklyn, Del.; Herbert L. Fritz, Englishtown, N.J.

[73] Assignee: E. I. Du Pont De Nemours and Company, Wilmington, Del.

[21] Appl. No.: 31,186

[22] Filed: Mar. 25, 1987

Related U.S. Application Data

[60] Continuation of Ser. No. 843,765, Mar. 25, 1986, abandoned, which is a continuation of Ser. No. 669,852, Nov. 9, 1984, abandoned, which is a division of Ser. No. 558,307, Dec. 5, 1983, Pat. No. 4,517,040.

[51] Int. Cl.$^4$ .............................................. B32B 3/24
[52] U.S. Cl. ................................... 428/131; 428/137; 428/210; 428/209; 428/901
[58] Field of Search ............... 428/131, 137, 209, 210, 428/901, 328

[56] References Cited

U.S. PATENT DOCUMENTS

| | | | |
|---|---|---|---|
| 4,020,206 | 4/1977 | Beil | 428/137 X |
| 4,283,243 | 8/1981 | Andreades et al. | 428/137 X |
| 4,303,715 | 12/1981 | Chang | 428/901 X |
| 4,360,570 | 11/1982 | Andreades et al. | 428/137 X |
| 4,456,652 | 6/1984 | Konishi et al. | 428/137 X |
| 4,479,991 | 10/1984 | Thompson | 428/137 X |

FOREIGN PATENT DOCUMENTS 0069457  5/1980  Japan .................................. 428/137

*Primary Examiner*—Nancy A. B. Swisher

[57] ABSTRACT

A conductive through-hole hole is formed by through a dielectric sandwiched between conductors forming a noncircular hole in a conductor, etching a hole through the dielectric and by deforming at the conductor which has been undercut during the etching.

8 Claims, 2 Drawing Sheets

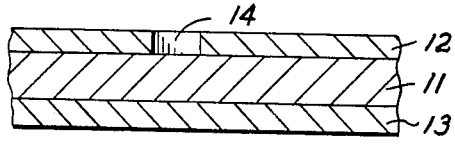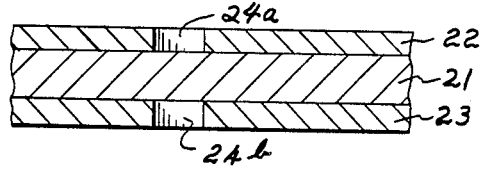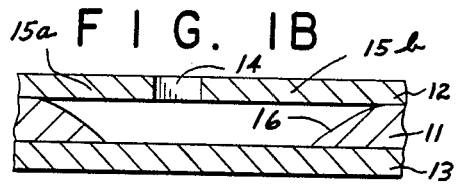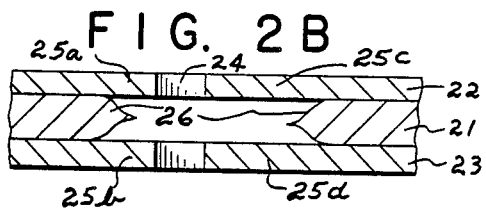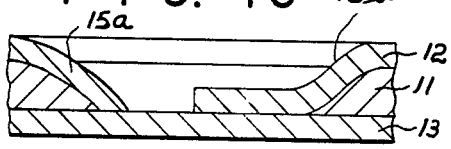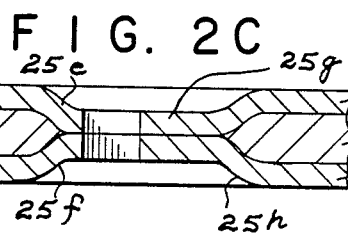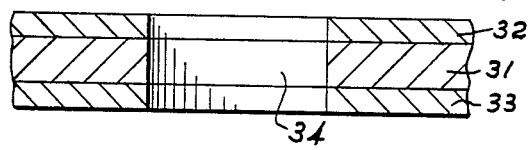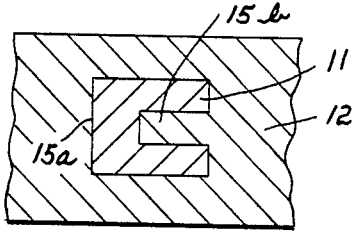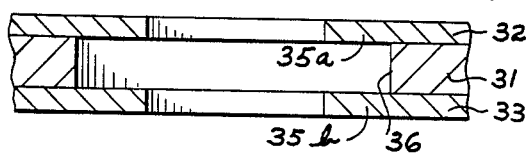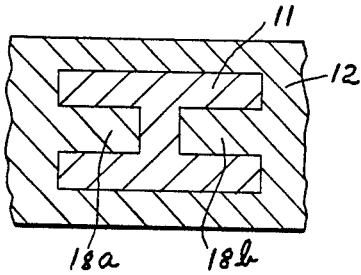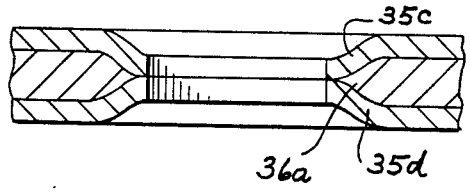

ARTICLE CONTAINING CONDUCTIVE THROUGH-HOLES

This application is a continuation of application Ser. No. 843,765, filed Mar. 25, 1986, now abandoned, which is a continuation of U.S. Ser. No. 669,852, filed Nov. 9, 1984, now abandoned, which is a division of application U.S. Ser. No. 558,307, filed Dec. 5, 1983, and now U.S. Pat. No. 4,517,040.

BACKGROUND OF THE INVENTION

The present invention is directed to an improved process for forming conductive through-holes through a dielectric, i.e., an insulating layer, sandwiched between two conductive layers. The process is particularly useful in formation of printed circuit boards.

U.S. Pat. No. 3,969,815 discloses a process for providing an electrical interconnection of two metal layers positioned on opposite sides of a substrate. A hole is initially drilled or bored completely through the two metal layers and the intermediate insulating layer. The hole in the insulating layer is enlarged by a selective etching process which only etches the insulating layer to form an enlarged annular hole in the insulating layer which undercuts the metal layer portions. Thereafter these overhanging metal portions on opposite sides of the insulating layer are deformed by pressure to contact or almost contact one another. The deformed metal portions are coated by galvanic metal which is overcoated by a thin layer, preferably tin, to form a conductive path.

SUMMARY OF THE INVENTION

The present invention is directed to a process for making an electrically conducting path in a dielectric layer sandwiched between two conductive layers comprising (a) forming a noncircular hole completely through one of the conductive layers without substantially removing material from the dielectric layer by etching a portion of the conductive layer;

(b) through said hole etching the dielectric layer whereby a pathway is formed completely through the dielectric layer between the conductive layers and whereby the conductive layer is undercut of dielectric material adjacent the hole in said conductive layer;

(c) deforming the conductive layer which has been undercut toward the other conductive layer, and (d) forming an electrical conducting path between the two conductive layers through the pathway.

BRIEF DESCRIPTION OF THE DRAWINGS

FIG. 1A is a cross-sectional view of a composite article of an electrically conductive layer, a dielectric layer and an electrically conductive layer with a hole through one conductive layer.

FIG. 1B is a cross-sectional view of the article of FIG. 1A with the addition of a hole formed through the dielectric layer by etching.

FIG. 1C is a cross-sectional view of the article of FIG. 1B except the electrically conductive layer has been deformed into the hole in the dielectric layer.

FIG. 1D is a top view of the article of FIG. 1A showing an outline of a hole formed in one conductive layer.

FIG. 1E is a top view of the article of FIG. 1 A showing another outline of a hole formed in the conductive layer.

FIG. 2A is a cross-sectional view of a composite article of an electrically conductive layer, a dielectric layer and an electrically conductive layer with a hole through each of the conductive layers.

FIG. 2B is a cross-sectional view of the article of FIG. 2A with the addition of a hole formed in the dielectric layer by etching.

FIG. 2C is a cross-sectional view of the article of FIG. 2B except the electrically conductive layers have been deformed into the hole in the dielectric layer.

FIG. 3A is a cross-sectional view of a composite article of an electrically conductive layer, a dielectric layer and an electrically conductive layer with a hole through the composite.

FIG. 3B is a cross-sectional view of the article of FIG. 3A with the addition of an enlarged hole in the dielectric layer.

FIG. 3C is a cross-sectional view of the article of FIG. 3B except the electrically conductive layers have been deformed into the hole.

DETAILED DESCRIPTION OF THE INVENTION

Figure 4:
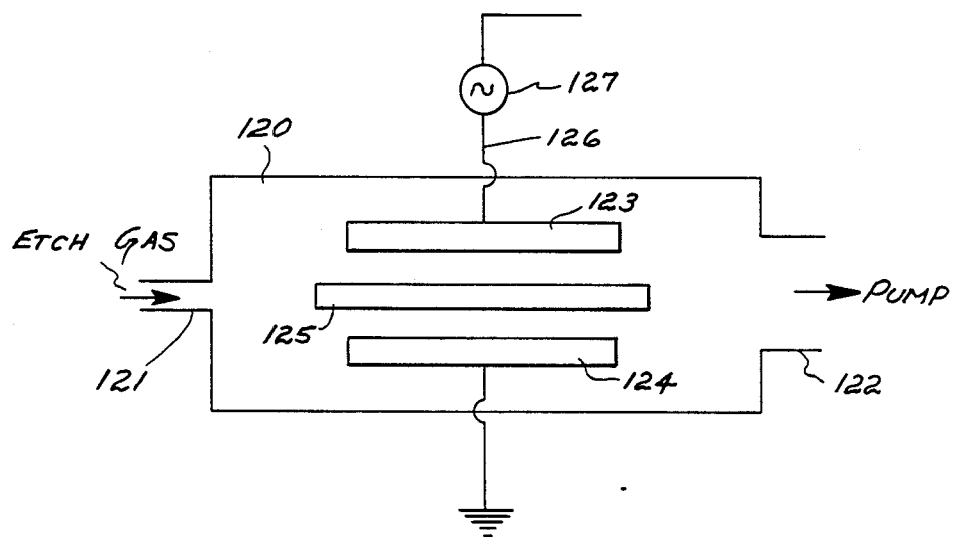
FIG. 4 is a schematic representation of a plasma apparatus useful in the present invention.

The present invention is particularly adapted for forming a conductive through-hole, and particularly a great number of precisely located through-holes, through a dielectric layer sandwiched between two electrically conducting materials. Generally the electrically conductive layers are metal, preferably copper, while the dielectric is generally an electrically insulating polymer.

Composites of two layers of an electrical conductive material separated by a dielectric are conventional starting materials for forming circuit boards and are suitable herein. Generally the dielectric layer will be at least one mil in thickness and the conductive layer will be 0.7 to 2.8 mil thick, e.g., copper foil, although both thinner and thicker layers can be used. The materials of construction of the insulating layer are not critical except that they can be etched using a liquid chemical etchant or a plasma.

In the present invention hole formation is necessary in one of the conductive layers without any substantial removal of material of the dielectric layer. Hole formation in a conductive layer preferably employs chemical etching which is well-known in the formation of printed circuits. An example of such chemical etching involves lamination of a negative acting photosensitive film to the conductor surface which does not face the dielectric layer, exposing the photosensitive polymer to actinic radiation through a photomask, developing and removing unexposed photosensitive polymer to expose portions of the metal layer and thereafter chemically etching completely through the thickness of the exposed conductive layer. This chemical etching step removes little or no material from the dielectric polymer layer. A suitable process is disclosed in Celeste U.S. Pat. No. 3,469,982. Positive working photopolymers with processing techniques well known in the art can likewise be used, e.g., Cohen and Heiart U.S. Pat. No. 4,193,797.

An outstanding advantage of photolithographic techniques concerns the physical geometry of the holes formed in the conductive layer. Any configuration of the hole can be formed in contrast to a drilling operation which imparts only a circular configuration. A noncircular hole in the present application means the hole will not have a constant radius in contrast to a circular hole of the same radius formed in a drilling operation. With noncircular hole formation, bending of the conductor is facilitated after it is undercut by removal of dielectric adjacent the hole in the conductor.

The diameter of the noncircular holes chemically etched in the conductive layer can be small, e.g., in the range of 150 to 300 microns in width. Also chemical etching of the conductive layer can form a great number of holes simultaneously, e.g., hundreds or thousands of holes can be easily formed in a composite blank for a circuit board of a dimension of 12 inches times 12 inches. In comparison, drilling or punching of a hole is a laborious process with an increased chance of error as the number of holes increases. Also drilling or punching of a hole generally results in a hole diameter not smaller than 325 microns.

Turning to the Figures, the embodiment of FIG. 1A shows a composite with a hole 14 chemically etched in the conductive layer 12. The hole is not completely circular with a noncircular configuration such as shown in FIG. 1D or FIG. 1E. These latter Figures are alternate top views of the FIG. 1A embodiment and show exposed insulating layer 11 beneath the conductive layer 12. FIG. 1D and FIG. 1E demonstrate right angles in the noncircular configuration which form tabs 15b and 18a and 18b respectively, although other angular configurations for the hole in the metal can be used. The angular configuration acts to minimize stress when the conductor adjacent the hole is bent in a subsequent operation in formation of the electrically conductive path through the dielectric layer.

Thereafter a selective etching process is employed to etch the dielectric layer through the hole formed in the conductive layer. The composite article formed thereby is shown in FIG. 1B wherein overhanging portions 15a and 15b are present in the conductive layer 12. The wall dielectric construction 16 is sloped due to the etching process whereby the etchant removes material completely through the thickness of the dielectric layer while at the same time etching the dielectric in a lateral direction in formation of a through-hole. The tab 15b is substantially more undercut than 15 because the tab is etched on three sides instead of one.

Two examples of etching techniques which etch completely through the dielectric layer and laterally to undercut the conductive layer are liquid chemical etching and plasma etching. Liquids etching techniques by which a liquid can etch selectively through a polymeric dielectric material are well-known in the art. The etchant will not cause a substantial removal of the conductive material. Suitable etchants include those disclosed in U.S. Pat. No. 3,969,815, e.g., a sulfuric acid solution can be used for polyester and epoxide resins while a caustic alcoholic solution is suitable for a polyimide. Also etching includes use of solvents capable of removing areas of the dielectric not masked by the conductive metal without any deleterious effect on the metal may be used. Examples of solvents are tetrachloroethylene, methyl chloroform, mixture of 90% tetrachloroethylene and 10% isobutyl alcohol (by volume), and chromic acid.

For plasma etching the metal conductive layer serves as a mask for the dielectric since the plasma attacks the dielectric where a hole has been formed. The metal is substantially unaffected by the plasma or, at least, the etching rate of the dielectric is considerably faster than the etching rate of the conductor.

Various types of plasma gases may be used. The etching gas is chosen so as to produce species which react chemically with the material to be etched to form a reaction product which is volatile. Mixtures of various plasma etch gases can also be used. Preferred gas composition to be used where the dielectric is a polyimide and the mask is copper is carbon tetrafluoride/oxygen in the ratio of 50/50 to 10/90 by volume.

FIG. 4 shows a schematic of a planar plasma etching apparatus which is useful in this invention. It consists of a chamber 120 which has an inlet 121 and an outlet 122 through which the plasma gas is pumped out. Within chamber 120 the radio frequency powered electrode (cathode) 123 which is connected by a conductor 126 to a conventional radio frequency generator 127, and the grounded electrode 124 are located. The material to be etched is located between electrodes 123 and 124. After the plasma gas has been introduced into the chamber the generator 127 is activated to create a gas plasma according to well known principles.

A suitable set of operating conditions for use with a copper conductor and a polyimide dielectric in a Branson Plasma Etcher Model 7411 is:
RF Power—>2,000 watts
RF Power Density—>0.06 watts/in$^2$,
Operating Pressure—>10 microns
Gas Composition—50/50→10/90 by volume $CF_4/O_2$
Gas Flow Rate—>150 cc/min.
RF Frequency—13.56 MHz
Part Bias—Cathode, anode or plasma potential
Exhaust Rate—>245 CFM Upon completion of the hole completely through the dielectric, the undercut conductive layer 15a and 15b is deformed to contact or come in close contact with layer 13. A suitable method is direct pressure application on the undercut conductive portions. This article embodiment is shown in FIG. 1C wherein the conductive portion 15a covers the etched dielectric surface 16 and the tab 15b extends over the lower conductor 13. FIG. 1C shows the embodiment of hole function in the insulator of FIG. 1A since tab 15b is longer in FIG. 1C than undercut portion 15a since the tab 15b can be undercut on three sides rather than the single side of 15a. For the construction of FIG. 1E, the tabs 18a and 18b could be identical in the final article, i.e., after deformation. Thereafter, if necessary, the deformed electrically conductive material may be electrolytically plated with a metal such as copper, electrolessly plated, or soldered or welded to complete or ensure an electrically conductive path through the dielectric layer. The tab 15b greatly aids in the plating or soldering of the electrically conductive path. The formation of through-holes in accordance with the present technique allows use of thin conductive layers, e.g., of 3.0 mils or less which cannot be used with drilling techniques in which a hole is drilled through the dielectric layer since the drilling would destroy the integrity of the second conductor, i.e., a hole would be formed in this second conductive layer. The noncircular configuration of the initial hole in the conductive layer allows deformation or bending of the conductive layer to proceed readily and at lower pressures. Also, once bent, the unsupported tab will be less likely to spring back from the conductive layer 13 than in a circular hole.

In an alternate embodiment of the present invention shown in FIGS. 2A, 2B and 2C, holes 24a and 24b are formed in both conductive layers 22 and 23 opposite one another rather than in one conductor shown in FIG. 1A. Except for this change the same process steps are employed except etching of the dielectric can proceed simultaneously from opposite surfaces. The metal conductors are undercut at 25a, 25b, 25c, and 25d. Tabs 25c and 25d are substantially more undercut since hole formation in the top and bottom conductors is similar to the FIG. 1D embodiment. With simultaneous opposite etching of the dielectric two distinct convex wall portions are present in the dielectric wall 26. After completion of the chemical etching of the polymer, the undercut conductive portions are deformed toward the other respective conductive layer to make contact or approximate contact. FIG. 2C illustrates the compressed conductive portions 25e, 25f, 25g and 25h in contrast with the dielectric surface 26a. With hole formation in the top and bottom conductors pursuant to the embodiment shown in FIG. 1E, the tabs would be identical prior to and after the deformation step. Thereafter, if desired, electrolytic plating, electroless plating, soldering or welding may take place to ensure electrical conductivity.

The embodiment of FIGS. 3A, 3B and 3C illustrate the article and through-holes formed following the teachings of U.S. Pat. No. 3,969,815. A composite of an electrically conductive layer 32, a dielectric 31 and an electrically conductive layer 33 has a hole 34 drilled or punched therein which is shown in FIG. 3A. In the FIG. 3B embodiment, a liquid chemical etchant has been used to selectively etch away the dielectric layer to form a wall 36 which is substantially planar with electrically conductive overhang portions 35a and 35b. In the FIG. 3C embodiment deformation of these conductive layers into the hole in the dielectric has taken place to form compressed, pinched conductive portions 35c and 35d with dielectric surface portion 36a bowed outwardly due to the force of the deformation of the conductive layers.

In contrast with this prior art teaching, the initial chemically etched hole in the conductor of FIG. 1A and FIG. 2A is of noncircular rather than circular configuration. As previously discussed a noncircular shape facilitates deformation. Also with the prior art drilling operation, hole formation takes place in both conductors unlike the FIG. 1A, FIG. 1B and FIG. 1C embodiments where only one conductor does not have any hole formed therein. Foils and other thin sheets can be used for the conductor which retains its integral shape. Also in comparison with the prior art, the article of the FIG. 1C and FIG. 2C embodiments can have less stress for the conductive portions in the passageways. Deformation of the dielectric takes place in formation of the conductive passageway shown in FIG. 3C of the prior art which can cause greater residual stress than the embodiments of the present invention. Also, generally the smallest hole that can be practically formed by mechanical drilling is of the order of 325 microns. In contrast with a chemical etching technique preferred in the present invention, the hole which is noncircular in the conductive layer can be considerably smaller, e.g., in the range of 150 to 300 microns. Of course, if necessary, larger holes can be formed.

The process of the present invention is particularly adapted to formation of multiple layers of circuitry. Illustratively after completion of a conductive path through the dielectric layer a new dielectric layer can be applied to at least one of the conductive layers and a new conductive layer can be applied to this dielectric layer. Application of the new dielectric and new conductive layers can be undertaken simultaneously to the article containing the electrically conductive through-hole, e.g., a dielectric layer and conductive layer compositive are laminated onto the conductive layer previously processed in formation of at least one through-hole. Thereafter a conductive path is formed through the newly applied dielectric layer in accordance with the technique previously disclosed.

In the following examples all parts and percentages are by weight unless otherwise indicated.

EXAMPLE 1

A heat curable polymer was coated on a 0.001 inch (0.0025 cm) polyethylene terephthalate sheet from 82% methylene chloride/18% ethyl cellosolve (47% solids), dried, and laminated to a polypropylene cover sheet. The dried polymer of 3.0 mils (0.0076 cm) thickness was of the following formula:

Copolymer of styrene-butadiene/acrylonitrile/methyl methacrylate: 23.6%
Methyl methacrylate (95.5)/ethyl acrylate (4.5) copolymer: 8.0
Di-(3-acryloxy-2-hydroxypropyl ether of Bisphenol A: 15.1%
Pentaerythritol triacrylate: 25.0%
Benzophenone: 5.3%
Bis acryloxy ethyl tetrabromo Bisphenol A: 10.0%
4,4'bisdimethyl aminobenzophenone: 0.3%
Monastral ® Green Pigment: 0.5%
3-Mercapto-1,2,4-triazole: 12.0%

The polypropylene cover sheet was removed and the tacky photopolymer was laminated to a piece of copper clad glass epoxy laminate. The polyethylene terephthalate sheet was removed and a piece of 1.0 mil (0.0025 cm) copper foil was laminated to the polymer coated copper clad substrate. Small 10 mil (0.025 cm) holes were formed in the copper foil using Riston ®1210 and the process described in U.S. Pat. No. 3,469,982. This process can be modified by formation of noncircular holes of approximately the same dimensions except a tab shape, as shown in FIG. 1D would be employed. The sample was immersed in an ultrasonic cleaner filled with methylchloroform for 45 seconds which removed polymer from the holes leaving a copper overhang of about 5 mils (0.0127 cm). The sample was rinsed in water to stop development and heat cured at 150° C. for 16 hours.

After development and curing, the copper/polymer/copper sandwich was placed in a laminating press and covered with a rubber pad that had a regular pattern of 4 mil posts (17,000/sq.in.). The press was pressurized to 1000 psi to collapse the copper overhangs onto the lower copper layer. The copper/polymer/copper sandwich was electroplated for 15 minutes at 30 amps/ft$^2$ in an acid copper sulfate plating bath.

The top of the plated sandwich was covered with Riston ®1210 film and 70 mil (0.1778 cm) pads were etched around the collapsed and plated holes using circuit etching techniques described in U.S. Pat. No. 3,469,982. The vias were electrically conductive.

EXAMPLE 2

A heat curable polymer composition was coated on a 1 mil (0.0025 cm) silicone treated polyethylene terephthalate film from methylene chloride (35% solids) and dried to a thickness of 2.0 mils (0.005 cm). The polymer composition had the following constituents.

Diacrylate ester of Bisphenol A epoxy resin (viscosity of 1,000,000 cp at 25° C., sp. grav.=1.2: 15.0%
pentaerythritol triacrylate: 10.0%
trimethylolpropane triacrylate: 15.0%
Ethyl acrylate (56)/methyl methacrylate (37)/acrylic acid (7) copolymer (mol. wt. 260,000, Acid No. 76–85): 25.0%
Hexamethoxymethylmelamine: 9.0%
Methylmethacrylate/butadiene/styrene copolymer (sp. grav.=1.0): 20.0%
Benzophenone: 5.0%
4,4'bisdimethylamino benzophenone: 0.3%
Monastral ® Green Pigment: 0.7%
[4-[Bis-[p-(dimethylamino)phenyl]methylene]-2,5-cyclohexadiene-1-ylidene-N-methanium chloride: 0.015%

The polymer composition was laminated to a (7.62 cm×7.62 cm) piece of copper clad glass epoxy laminated. The polyethylene terephthalate film was removed and a 1.0 mil (0.0025 cm) thick copper foil was laminated to the polymer composition. Also as described in Example 1, noncircular holes, such as in a tab shape could be formed. 10 mil (0.025 cm) holes were formed in the copper foil using the process described in Example 1. The assembled sandwich was immersed in a methylchloroform spray to remove polymer composition from the holes and to undercut the holes in the copper foil by about 3 mils (0.0076 cm) in all directions. After development the package was thermally cured by baking for one hour at 150° C.

The copper foil overhangs were then individually collapsed using a small metal probe.

The part may then be electroplated in a standard acid copper electroplating bath to further enhance the interconnection caused by collapsing the overhanging copper foil onto the copper clad laminate.

The top copper foil may then be covered with Riston ®1210 and processed as described in Example 1 to define the desired circuit pattern.

The process steps can be repeated to build multilayer circuit boards with blind interconnections.

EXAMPLE 3

A film is coated on copper clad glass epoxy laminate from methylene chloride (35% solids). After drying the film is 2 mils (0.005 cm) thick and has the following composition:

| | |
|---|---|
| (methyl methacrylate (95.5)/ ethyl acrylate (4.5) copolymer | 50 parts |
| (CH₂——CH—CH₂—O—⟨O⟩—)₂ (epoxy diglycidyl ether structure) | 45 parts |
| Dicyanodiamide N≡C—NH₂—C(=NH)—NH₂ (finely divided) | 5 parts |

A one mil (0.0025 cm) thick copper foil is heat laminated to the coating. Ten mil (0.025 cm) holes are etched in the top copper foil using techniques known to those familiar with the art of circuit board manufacturing. Also as discussed in Example 1 noncircular holes such as in a tab shape could be formed. The sample board is immersed in an ultrasonic cleaner filled with methyl chloroform for 1 minute to remove the polymer-epoxy coating leaving 5 mil (0.0127 cm) copper overhangs. A 10 mil (0.025 cm) thick cardboard sheet and a 40 mil (0.10 cm) silicone rubber pad are placed on top of the developed sample. A pressure of 20,000 psi is applied with a laminating press to collapse the copper overhangs onto the underlying copper clad glass epoxy. The sample is cured at 150° C. for 1 hour. The sample is electroplated with ½ mil (0.00127 cm), of copper using conventional electroplating techniques to insure good electrical connections. Finally, the top copper foil is patterned with the desired circuit pattern using standard circuit etching techniques to complete the circuit board.

EXAMPLE 4

A thermally curable polymer is coated from methylene chloride (35% solids) onto a polyethylene terephthalate film. The polymer had the following composition:

| Component | % |
|---|---|
| Diacrylate ester of bis-phenol A | 20 |
| Pentaerythritol triacrylate | 20 |
| Methyl methacrylate (95.5)/ethyl acrylate (4.5) copolymer | 6 |
| Styrene-butadiene/acrylonitrile/ methyl methacrylate copolymer | 27 |
| Benzophenone | 4.0 |
| 4,4'bis dimethyl amino benzophenone | 0.5 |
| Clay (0.5 micron) | 22.0 |
| Monastral ® Green Pigment | 0.5 |

The dried coating was 0.002 inch (0.0051 cm) thick. Two layers (0.004 inch, i.e., 0.0102 cm) were laminated to a piece of copper clad glass epoxy. The coating sheet was removed after each lamination. A piece of 0.001 inch (0.00254 cm) copper foil was laminated to the tacky polymer to form copper/polymer/copper clad laminate structure.

A pattern of 0.01 inch (0.0254 cm) holes was formed in the laminated copper foil using Riston ®1210 and the process described in Example 1. Also as discussed in Example 1, noncircular holes such as a tab shape could be formed. The part was then immersed in methyl chloroform in an ultrasonic cleaner for 1 minute to remove the polymer from the holes leaving a copper overhang of at least 0.005 (0.0127 cm). The part was cured thermally for 8 hours at 150° C. After curing, the part was placed in a laminating press, hole side up, and covered with a dimpled rubber pad as described in Example 1. A pressure of 1,000 psi was applied for 10 seconds to collapse the copper foil overhang so it touched the copper laminate. The part was removed from the press, and electroplated in a standard acid copper electroplating bath to enhance the connection. The side of the part with the collapsed overhang is then covered with Riston ®1210 and processed as described in Examaple 1 to define the desired circuit pattern.

EXAMPLE 5

Example 4 was repeated with the following exception:

The copper foil overhangs were individually collapsed with a small metal probe.

EXAMPLE 6

A 6"×6" (15.24 cm×15.24 cm) panel of 0.006 inch (0.01524 cm) thick Pyralux ®LF-9111 laminate (manufactured by the Du Pont Company) was provided with a circuit pattern on one side and 10 mil (0.0254 cm) in diameter holes in the copper foil on the other side by using Riston ®215R and the process described in U.S. Pat. No. 3,469,982. Also as discussed in Example 1 noncircular holes such as a tab shape could be formed. The holes coincide with the location where the through-holes will be formed between the copper foil having 10 mil holes and the foil on the circuit patterned side. Where connections are to be made to the aluminum plate the copper foil on the circuit side is removed. The circuit pattern side of the panel was then laminated to an aluminum plate using 0.002 inch (0.0057 cm) thick Pyralux ®WA adhesive in a lamination press at 350 psi, at 350° F. (176.7° C.) for 45 minutes.

The part was then plasma etched in a plasma etching chamber of a Branson Plasma Etcher Model 7411, a vacuum was drawn to a base pressure of 50 microns and the gas comprising 70% $O_2$, 29% $CF_4$ and 1% argon (by volume) was introduced until the chamber pressure reached 200 microns. The pump rate was 550 CFM and gas flow rate was estimated to be 750 cc/min. The RF power was turned onto a setting of 3800 watts for a duration of 70 minutes. The aluminum plate acts as a mask to the plasma protecting the circuit pattern. The copper foil with the 0.01 inch (0.0254 cm) holes acts as a mask to the plasma on the other side of the panel allowing etching to occur only where the holes have been formed in the copper foil. The plasma etches through the 0.003 inches (0.0076 cms) of dielectric until it contacts the metal foil circuit pattern or through the 0.005 inches (0.0127 cm) of dielectric until it reaches the aluminum plate.

The overhangs were then collapsed by placing the panel in a laminating press. A cardboard pressure equalizing sheet was placed next to the copper foil with the cantilevered beam. A silicone rubber pad was placed on top of the cardboard sheet and a steel caul plate was placed over it. 18,000 psi pressure was applied for 10 seconds to collapse the overhang into the hole. Also as described in Example 1, noncircular holes with a tab shape could be formed. A circuit pattern was then formed in the copper foil using conventional imaging and etching techniques described in U.S. Pat. No. 3,469,982. To enhance the interconnection, the panel was dipped in a 60/40 tin/lead solder at 500° F. (260 C.°) for 5 seconds to coat the interconnection with solder.

EXAMPLE 7

Overhangs were formed in the panel and collapsed as described above with one exception, the circuit pattern side of the panel was laminated to a copper clad glass epoxy board instead of the aluminum plate before plasma etching. After plasma etching and collapsing, the panel was then pattern plated using Riston ®1215 as a plating resist in a copper sulfate plating bath for 30 minutes at 30 ASF and in a tin/lead fluoroborate bath for 15 minutes at 15 ASF to enhance the via connection between the upper and lower conductive layers. Finally the plating resist was stripped and the background copper was etched using conventional techniques to form a circuit pattern on the top.

EXAMPLE 8

A 6"×6" (15.24 cm×15.24 cm) panel of ~0.006 inch (0.1524 cm) thick Pyralux ®9111 laminate (manufactured by the Du Pont Company) with holes ranging from 3 to 15 mils (0.0076–0.038 cm) photolithographically formed in both of the copper foils was used. Also as discussed in Example 6 noncircular holes such as in a tab shape could be formed. The panel was plasma etched using the process and apparatus described in Example 6 to give overhangs of copper foil on both sides of the panel. The overhangs were collapsed into the hole, a circuit pattern was formed on both of the copper foils, and the interconnection was enhanced as described in Example 6.

EXAMPLE 9

A 0.004 inch (0.0102 cm) thick laminate of epoxy resin impregnated, Kevlar ® fabric having 0.0014 inch (0.003556 cm) copper foils adhered to both sides was coated with Riston ®215R on both sides. 0.010 inch (0.0254 cm) and 0.005 inch (0.0127 cm) holes were photolithographically formed in the copper foils, using conventional techniques described in U.S. Pat. No. 3,649,982. Also as discussed in Example 1 noncircular holes such as in a tab shape could be formed.

The panel was plasma etched using the process and apparatus described in Example 6 to give overhangs of copper foil on both sides of the panel. The overhangs were collapsed into the hole, a circuit pattern was formed on both of the copper foils, and the interconnection was enhanced as described in Example 6.

EXAMPLE 10

Five 3"×6" (7.62 cm×15.24 cm) panels of 0.006 inch (0.01524 cm) thick Pyralux ® double sided copperclad laminate (LF9111, manufactured by E. I. du Pont de Nemours and Company, Wilmington, DE) were provided with a circuit pattern on one side and 15 mil circular holes in the copper foil on the other side by using Riston ®1215 and the process described in U.S. Pat. No. 3,469,982. The circular holes were located to provide connections either to the circuit elements on the other side of the laminate or to a copper ground plane. The circuit pattern side of the flexible circuit was laminated to copper glad glass epoxy boards using 0.002 inch (0.0057 cm) thick Pyralux ®WA adhesive (Du Pont Company) in a laminating press at 350 psi at 350° F. for one hour.

Seven 7.5 in×9 in (19.05 cm×22.86 cm) panels of 0.006 inch (0.01524 cm) thick Pyralux ® double sided copper clad laminate (LF9111, manufactured by E. I. du Pont de Nemours and Company) were provided with a circuit pattern on one side and noncircular holes, 0.012 mils on a side like those shown in FIG. 1D, by using Riston ®1215 and the process described in U.S. Pat. No. 3,469,982. These flexible circuits were laminated to copper clad glass epoxy board as described above.

The parts were then plasma etched as in Example 6. The overhangs were collapsed by placing the parts in a laminating press, covering them with a rubber pad that had a regular pattern of 7 mil posts (4,000/sq. in) and pressurizing the press to 5000 pounds per square inch for 10 seconds. The boards were pattern plated as in Example 7. Electrical testing showed that 98% of 375 round interconnections or vias were electrically conductive and greater than 99.9% of the 3920 noncircular vias (see FIG. 1D) were electrically good. Microscope pictures of cross-sectioned interconnections show that noncircular interconnects are collapsed more uniformly and electroplated more uniformly than the circular interconnects.

What is claimed is:

1. An article consisting of three layers of two conductive layers with at least one of the layers covering a surface of the article and being copper foil separated by a dielectric layer with an electrically conductive path through a noncircular hole without a constant diameter in the dielectric layer having a sloping wall construction to form said hole at least part of the conductive path formed by bending a portion of the one conductive layer of copper foil having an opening in the range from 150 to 300 microns and overhanging said hole extending through the dielectric layer without penetrating through the other conductive layer with the bent overhang and the one conductive layer being of identical material of copper foil and wherein stress is present in the copper foil due to bending of the overhang.

2. The article of claim 1 which is a circuit board and contains at least a hundred conductive paths through the dielectric layer.

3. The article of claim 1 wherein the foil is of a thickness not greater than 3.0 mils.

4. The article of claim 1 wherein the foil is of a thickness in the range from 0.7 to 2.8 mils.

5. The article of claim 1 wherein both conductive layers are copper foils.

6. The article of claim 5 wherein both foils have a thickness not greater than 3.0 mils.

7. The article of claim 6 wherein both foils have a thickness in the range from 0.7 to 2.8 mils.

8. An article comprising two conductive layers separated by a dielectric layer with an electrically conductive path through a hole in the dielectric layer formed by bending a portion of one of the conductive layers which overhangs a hole extending through the dielectric layer but not through the other conductive layer with the overhang formed by a noncircular hole in the conductive layer with said article made by the steps of
    (a) forming a noncircular hole completely through one of the conductive layers without substantially removing material from the dielectric layer by etching a portion of the conductive layer;
    (b) through said hole etching the dielectric whereby a pathway is formed completely through the dielectric layer between the conductive layers and whereby the conductive layer is undercut of dielectric material adjacent the hole in said conductive layer;
    (c) deforming the conductive layer which has been undercut toward the other conductive layer, and
    (d) forming an electrical conducting path between the two conductive layers through the pathway.

* * * * *